United States Patent
Sharma et al.

(10) Patent No.: US 12,366,594 B2
(45) Date of Patent: Jul. 22, 2025

(54) CURRENT SENSING

(71) Applicant: Cirrus Logic International Semiconductor Ltd., Edinburgh (GB)

(72) Inventors: Kapil R. Sharma, Dalkeith (GB); Kathryn R. Holland, Cedar Park, TX (US); Matthew Petherbridge, Edinburgh (GB); Peter Hsu, Edinburgh (GB); John B. Bowlerwell, Dunfermline (GB)

(73) Assignee: Cirrus Logic Inc., Austin, TX (US)

( * ) Notice: Subject to any disclaimer, the term of this patent is extended or adjusted under 35 U.S.C. 154(b) by 134 days.

(21) Appl. No.: 18/347,715

(22) Filed: Jul. 6, 2023

(65) Prior Publication Data

US 2024/0012035 A1    Jan. 11, 2024

Related U.S. Application Data

(60) Provisional application No. 63/359,260, filed on Jul. 8, 2022.

(30) Foreign Application Priority Data

Sep. 2, 2022  (GB) ........................... 2212808

(51) Int. Cl.
  *G01R 19/00*   (2006.01)
(52) U.S. Cl.
  CPC ................. *G01R 19/0092* (2013.01)
(58) Field of Classification Search
  CPC .. G01R 19/0092; G01R 19/10; G01R 19/203; G01R 19/0046
  See application file for complete search history.

(56) References Cited

U.S. PATENT DOCUMENTS

| | | | |
|---|---|---|---|
| 5,539,158 A * | 7/1996 | Utsunomiya | ......... G01L 1/2243 73/862.632 |
| 6,850,384 B1 | 2/2005 | Bennett | |
| 9,793,864 B2 * | 10/2017 | Won | ...................... G01R 19/22 |

(Continued)

FOREIGN PATENT DOCUMENTS

| | | |
|---|---|---|
| GB | 2458559 A | 9/2009 |
| GB | 2606440 A | 11/2022 |
| JP | 2017098817 A | 1/2017 |

OTHER PUBLICATIONS

Combined Search and Examination Report under Sections 17 and 18(3), UKIPO, Application No. GB2212808.6, mailed Feb. 20, 2023.

(Continued)

*Primary Examiner* — Dominic E Hawkins
(74) *Attorney, Agent, or Firm* — Jackson Walker L.L.P.

(57) ABSTRACT

This application relates to methods and apparatus for sensing current in a monitored current path, where the monitored current path is bidirectional such that current can flow in either direction along the monitored current path. A current sensor has first and second sense resistors (401a, 401b) configured to each pass a current corresponding to the current in the monitored current path. The first and second sense resistors are configured to have a matching arrangement, such that current flow through the first sense resistor when current is flowing in one direction in the monitored current path matches current flow through the second sense resistor when current is flowing in the opposite direction in the monitored current path.

21 Claims, 5 Drawing Sheets

(56) References Cited

U.S. PATENT DOCUMENTS

| | | | | |
|---|---|---|---|---|
| 2012/0293017 A1* | 11/2012 | Lidsky | ............... | H02H 3/202 |
| | | | | 307/130 |
| 2017/0355350 A1* | 12/2017 | Namou | ............... | B60L 50/60 |
| 2019/0116420 A1 | 4/2019 | Chawla | | |
| 2021/0048453 A1* | 2/2021 | Chao | ............... | H03F 3/45071 |
| 2021/0344310 A1* | 11/2021 | Zanbaghi | ............ | H03F 3/2173 |
| 2022/0029410 A1* | 1/2022 | Fukuhara | ............ | H03F 3/45475 |
| 2023/0081639 A1* | 3/2023 | Maggi | ................ | G05F 1/575 |

OTHER PUBLICATIONS

Examination Report under Section 18(3), UKIPO, Application No. GB2212808.6, issued Jul. 1, 2024.
Examination Report under Section 18(3), UKIPO, Application No. GB2212808.6, issued Oct. 28, 2024.

* cited by examiner

CURRENT SENSING

FIELD OF DISCLOSURE

The field of representative embodiments of this disclosure relates to methods, apparatus and/or implementations concerning or relating to current sensing.

BACKGROUND

There are many applications where some sensing of an electric current is required, for instance, for control and/or protection of an electric circuit. One example where current sensing may be applied is for driver circuits for driving a load, for instance switching drivers such as class-D drivers.

FIG. 1 illustrates, schematically, an example of a class-D output stage 100 for driving a load 101. In the example of FIG. 1, the load 101, which may in some applications be a loudspeaker or other transducer, is connected in a bridge-tied-load (BTL) configuration between first and second output terminals 102a and 102b. Output terminal 102a may be selectively switched between high-side and low-side switching voltages VH and VL by high-side and low-side switches SHa and SLa respectively. Note that as used herein the terms high and low in respect to the switching voltage should be understood as referring to voltage which are more or less positive than one another and nothing is implied about the magnitude of such voltages. The high-side and low-side switches may generally be implemented by suitable transistors, such as a PMOS and NMOS device respectively. Likewise output terminal 102b may be selectively switched between the switching voltages VH and VL by switches SHb and SLb. In use, a controller 103 controls the duty cycle of switching of the respective output terminals 102a and 102b between the switching voltages so as to generate a desired differential driving signal across the load 101, e.g. based on an input signal Sin.

In such a driver circuit it may be desirable to monitor, in use, the load current, for instance so as to implement overcurrent protection and/or for other control functions. In some cases, the load current may be monitored using a sense resistor 104. The sense resistor 104 may be located in a suitable path on one side of the load so as to be in series with the load in all switch states of the driver, and FIG. 1 illustrates schematically that the sense resistor may be coupled between a midpoint connection for switches SHa and SLa and the load 101. A current monitor 105 may monitor the voltage drop across sense resistor 104 and determine the load current. An indication of the determined load current may be provided to the controller 103, e.g. for overcurrent protection.

To limit power loss and heat dissipation via the sense resistor, the sense resistor 104 may be implemented to have a relatively low resistance. The sense resistor 104 may be formed from a suitable resistive material such as, for example, tantalum nitride (TaN) which can be implemented as a suitable thin film resistor.

The use of such a sense resistor can provide useful current monitoring. However, in some cases, the sense resistor may exhibit non-linearity in use, which can adversely impact the accuracy of the current sensing.

SUMMARY

Embodiments of the present disclosure relate to improved current sensing circuits and to methods of operation.

According to an aspect of the disclosure there is provided a current sensor for sensing current in a monitored current path, wherein the monitored current path is bidirectional such that current can flow in either direction along the monitored current path. The current sensor comprises first and second sense resistors configured to each pass a current corresponding to the current in the monitored current path. The first and second sense resistors are configured to have a matching arrangement, such that current flow through the first sense resistor, when current is flowing in one direction in the monitored current path, matches current flow through the second sense resistor, when current is flowing in the opposite direction in the monitored current path.

The first and second sense resistors may each be located in the monitored current path.

In some implementations, each of the first and second sense resistors may be arranged such that current can flow, via the respective sense resistor, from a respective first transistor to a respective first electrode or from the respective first electrode to a respective second transistor. For current flow in a first direction in the monitored current path, current may flow through the first sense resistor from the respective first transistor to the respective first electrode and current may flow through the second sense resistor from the respective first electrode to the respective second transistor. For current flow in a second direction in the monitored current path, current may flow through the first sense resistor from the respective first electrode to the respective second transistor and current may flow through the second sense resistor from the respective first transistor to the respective first electrode. The first transistor may be a PMOS transistor and the second transistor may be an NMOS transistor. A spatial configuration of the first sense resistor with respect to the respective first and second transistors and first electrode may match a spatial configuration of the second sense resistor with respect to the respective first and second transistors and first electrode.

In some implementations, the current sensor may comprise a monitor circuit configured to determine voltages across the first and second sense resistors and to provide an indication of current in the monitored current path based on the determined voltages. In one example, the monitor circuit may be configured to generate a first summed voltage as a sum of a voltage on a first side of the first sense resistor with a voltage on a first side of the second sense resistor, generate a second summed voltage as a sum of a voltage on a second side the first sense resistor with a voltage on a second side of the second sense resistor; and determine the voltage difference between the first and second summed voltages. In another example, the monitor circuit may be configured to generate a first difference voltage as the difference between voltage on first and second sides of the first sense resistor, generate a second difference voltage as the difference between voltages on first and second sides of the second sense resistor; and determine the voltage sum between the first and second difference voltages. The first side of the first and second sense resistors may be the side that receives an input current when current is flowing in the monitored current path in a first direction.

In some implementations, each of the first and second sense resistors may comprise a thin-film resistor material, for example each of the first and second sense resistors may comprise a tantalum nitride resistor. In some implementations, each of the first and second sense resistors may comprise a plurality of connected resistor segments wherein at least some of the plurality of resistor segments are not co-linear. At least some of the plurality of resistor segments may be substantially parallel to one another and arranged in a serpentine or comb configuration.

Each of the first and second sense resistors may comprise a plurality of sense points for sensing the voltage across at least part of the sense resistor. In some examples, each of the first and second sense resistors may comprise more than two sense points located at different locations of the sense resistor so as to enable a voltage across different parts of the sense resistor to be determined.

The monitored current path may be an output path for a switching driver for driving a load in a bridge-tied-load configuration. The first sense resistor may be connected in the output path for providing an output to one side of the load and the second sense resistor may be connected in the output path for providing an output to an opposite side of the load. In this case, when the current sensor comprising a monitor circuit configured to determine voltages across the first and second sense resistors and to provide an indication of current in the monitored current path based on the determined voltages, the monitor circuit may be configured to compare the indication of current in the monitored current path against a current threshold to detect an overcurrent condition on either side of the load.

The current sensor may be implemented as an integrated circuit. The current sensor may be embodied as part of an electronic device.

In another aspect there is provided a current sensor for sensing current in a monitored current path, wherein the monitored current path is bidirectional such that current can flow in either of a first direction or a second, opposite, direction along the monitored current path. The current sensor comprises first and second sense resistors configured to each pass a current corresponding to the current in the monitored current path. The first and second sense resistors are configured such that: a spatial arrangement of active current sources and sinks for the first sense resistor with current in the monitored path in the first direction matches a spatial arrangement of active current sources and sinks for the second sense resistor with current in the monitored path in the second direction; and a spatial arrangement of active current sources and sinks for the first sense resistor with current in the monitored path in the second direction matches a spatial arrangement of active current sources and sinks for the second sense resistor with current in the monitored path in the first direction.

In some implementations, the current sources and sinks for each of the first and second sense resistors may comprise respective first and second transistors and a respective output electrode.

In a yet further aspect there is provided a current sensor for sensing current in a monitored current path, wherein the monitored current path is bidirectional such that current can flow in either direction along the monitored current path, where the current sensor comprises a first sense resistor configured to pass a current corresponding to the current in the monitored current path, wherein the first sense resistor exhibits a non-linearity with direction of current flow in the monitored current path and a second sense resistor configured to pass a current corresponding to the current in the monitored current path, wherein the second sense resistor exhibits a non-linearity with direction of current flow in the monitored current path. The non-linearity of the first sense resistor is opposite to the non-linearity of the second sense resistor.

The non-linearity of the first sense resistor may be equal and opposite to the non-linearity of the second sense resistor.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the disclosure relate to current sensing circuitry and, in particular, to current sensing circuitry in which the monitored current path may be bidirectional. Embodiments of the disclosure also relate to methods of current sensing.

As discussed above, in some applications a sense resistor may be used to provide current monitoring for a current path, for instance as discussed with reference to FIG. 1, a sense resistor may be used to monitor the load current in a switched driver circuit, such as a class-D driver. In some implementations, however, the sense resistor may exhibit some non-linearity in use that could negatively impact on accuracy of the current monitoring.

The sense resistor may be provided by a suitable thin film resistor material, such as tantalum nitride (TaN). Typically a layer of such resistor material is patterned into a desired shape to provide the sense resistor, with at least two force points provided by electrodes for connecting the resistor to the relevant current path and also at least two sense points provided by electrodes positioned to sense a voltage drop across the resistor.

Figure 2:
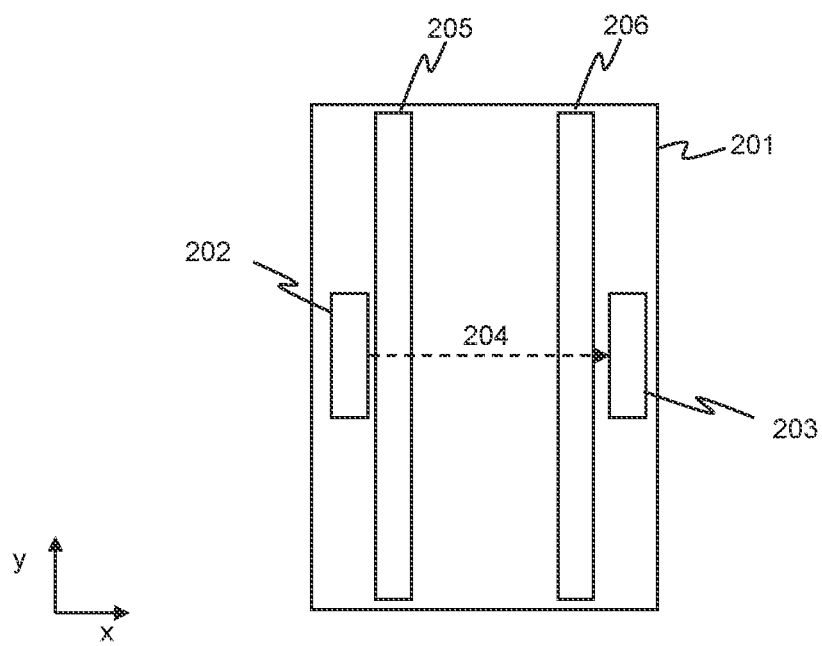
FIG. 2 illustrates the principles of a sense resistor.

For example, FIG. 2, illustrates a layer of resistor material 201, such as TaN, forming at least part of a sense resistor, with a pair of sense points 202 and 203 and a pair of force points 205 and 206. The force and sense points may comprise conductive material, such as metal, which contact the resistive layer, possibly by vias through one or more intervening dielectric layers. In use, current is injected into and extracted from the resistor material via the force points 205 and 206 and, in this example the arrangement of the force point 205 and 206 is such that the direction of current flow is generally expected to be in the direction illustrated by arrow 204 (which is illustrated as the x-direction in this example) and the pair of sense points 202 and 203 are displaced from one another in the direction of current flow.

The dimensions of the sense resistor are selected to provide a desired nominal resistance and current handling capacity. As one skilled in the art will understand, for a generally rectangular sense resistor such as illustrated in FIG. 2, the resistance is nominally equal to $R_S*(L/W)$, where $R_S$ is the sheet resistance of the resistor material, L is the length of the resistor (in the direction of current flow, i.e. the x-direction in this example) and W is the width of the resistor (in the y-direction in this example). To provide a suitably low resistance, e.g. of the order of a few tens of milliohms in some applications, the aspect ratio (W/L) of a generally linear sense resistor may be quite high, i.e. the width W of the sense resistor may be much greater than the length L of the sense resistor.

Especially for sense resistors with such an aspect ratio, where the length in the direction of current flow is significantly lower than the width of the sense resistor, the current density through the sense resistor may, in use, exhibit some spatial variation. Factors such as the way that current is injected into or extracted from the sense resistor and/or inhomogeneity of the material of the sense resistor can lead to a spatial variance in the current density throughout the sense resistor. In some cases, the spatial variation of current density can vary dynamically in use, which can lead to non-linearities in the sensed current.

In practical implementations, the pair of sense points 202 and 203 determine voltages from only part of the sense resistor, for instance the sense points may not typically extend along the whole width of the sense resistor, and thus the voltage drop between the relevant sense points 202 and 203, and hence the sensed current, depends on the relevant current densities in the region of the resistive layer 201 with close proximity to the sense points. In such a case, if the current density through the resistive layer local to the relevant pair of sense points varies, in use, in a way that is not proportional to overall current magnitude, the resultant sensed current will experience non-linearities.

For the application to sense a load current in a switching driver, one factor that can lead to non-linearity is the fact that the current through the sense resistor is bidirectional. For instance, referring back to FIG. 1, the load current through the sense resistor 104 may flow in either direction depending on the switch state of the driver. In a first switch state, with switch SHa closed, i.e. on, (and SHb open, i.e. off) to connect one side of the load 101 to VH and switch SLb closed (and SHb open) to connect the other side of the load to VL, current will flow through switch SHa, sense resistor 104, load 101 and switch SLb. In a second switch state, with switches SLa and SHb closed (and SHa and SLb open) the current flows via these switches and in the opposite direction through the load 101 and sense resistor 104. This means that, in the first switch state, current flows into the sense resistor from switch SHa and onto the output terminal 102a and, in the second switch state, current flows from the output terminal 102a through sense resistor 104 to the switch SLa. In practice, this can alter the spatial distribution of active current sources and sinks, as seen by the sense resistor 104, especially if the source and sink for the current in the sense resistor 104 are not symmetrical with the sense points and geometry of the sense resistor 104, which can result in a spatial variation in current density throughout the sense resistor which can impact the current monitoring. In effect, the current may flow through the sense resistor in a different way when flowing in opposite directions. Therefore, a given current flowing through the sense resistor with the driver in the first switch state may give rise to a different value of sensed current compared to the same magnitude of current flowing through the sense resistor in the opposite direction with the driver in the second switch state, under the same operating conditions.

For some integrated circuits, for instance integrated circuits formed into a CSP package, it may be possible to implement current force and sink paths through a metal redistribution layer (RDL), or similar planar metal layers on the chip, in a way that limits non-linearity due to spatial variation in current flow through the sense resistor. It has been proposed that the resistor current force path for the sense resistor could be formed with a circular shape in the RDL layer, to aid in uniform current density into a sense resistor when the output current path is a wafer-level chip-scale package (WLCSP) solder bump. However, other packaging technologies, e.g. such as QFN, do not have a redistribution layer and the use of a circular sense resistor may not provide the same benefits for such packaging technologies and/or can be layout inefficient.

Figure 1:
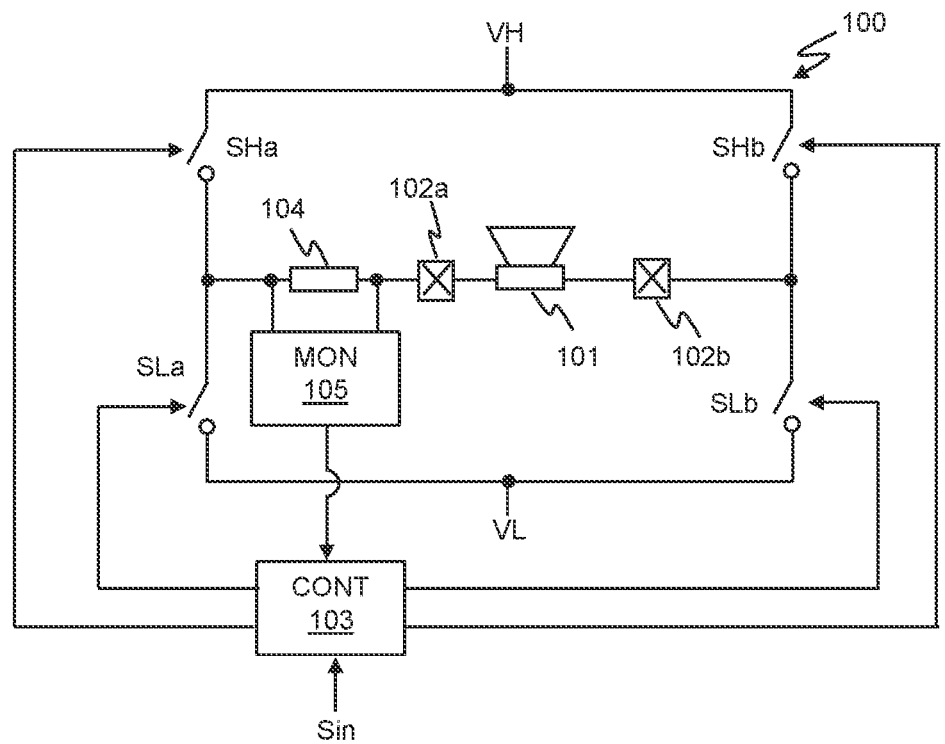
FIG. 1 illustrates one example of a driver circuit with current sensing.

It is noted that whilst FIG. 1 illustrates that the sense resistor is coupled in a common path between the output terminal 102a and a midpoint node between the switches SHa and SLa, in a practical integrated circuit implementation it may generally be desirable for the sense resistor to be coupled to the outputs of the relevant transistors that provide the switches with only a relatively limited amount of intermediate metal connection. This may be more efficient in terms of minimising circuit area and/or avoiding unnecessary metallisation for conductive pathways. Thus, the high-side switch transistor may, in use, couple to the sense transistor in a way which is spatially different to the coupling between low-side switch transistor and the sense resistor. In other words, the current source(s) and sink(s), as seen by sense resistor when operating in the first driver state have a different spatial arrangement compared to the current sink(s) and source(s) as seen by the sense resistor when operating in the second switch state.

Figure 3:
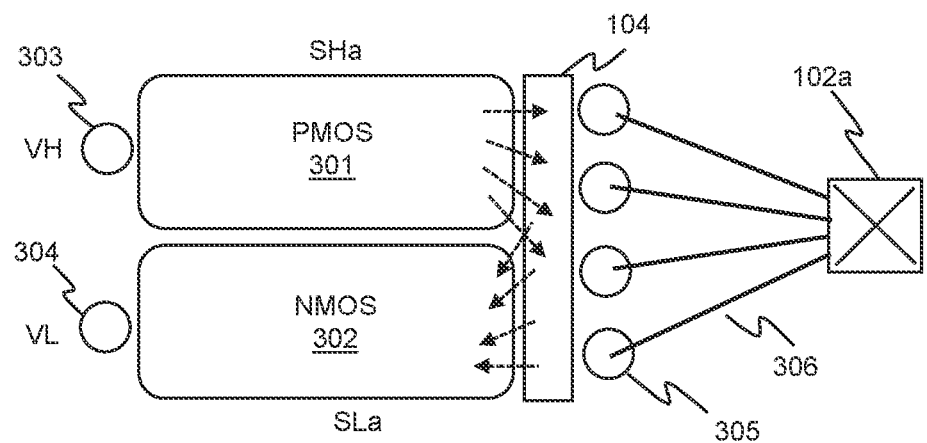
FIG. 3 illustrates one example layout of a sense resistor with respect to high-side and low-side transistors and an output terminal.

FIG. 3 illustrates this principle. FIG. 3 illustrates one example of a possible circuit layout for the current forcing paths for high-side and low-side switches SHa and SLa and sense resistor. It should be understood, however, that the layout of FIG. 3 is a simplified pictorial layout for the purposes of explanation and is not intended to be an accurate representation of an actual physical implementation.

Transistors 301 and 302, in this example a PMOS device and an NMOS device respectively, are provided as the high-side and low-side switches SHa and SLa respectively. The PMOS 301 is associated with an electrode 303 for receiving the high-side voltage VH and the NMOS 302 is associated with an electrode 304 for receiving the high-side voltage VL. The sense resistor 104, which may generally have the same structure as the sense resistor 201 discussed with reference to FIG. 2 but with separate force points for connecting to the PMOS 301 and NMOS 302, is coupled between the PMOS and NMOS switches 301 and 302 and at least one output electrode 305, which is electrically connected to the output terminal 102a. Depending on the type of circuit implementation, e.g. the packaging of an integrated circuit implementation, the output electrode(s) 305 may be coupled to the output terminal 102a in a variety of ways, e.g. by bond wires 306 or the like. FIG. 3 illustrates an example with four output electrodes 305, but, in some implementations, there could be greater or fewer output electrodes (in some cases there could just be one output electrode). Similarly there could, in some cases, be additional electrodes for the high-side voltage and/or the low-side voltage.

In use, in the first driver switch state, the PMOS 301 is on and acts as an active current source for the sense resistor 104 and in the second driver switch state the NMOS is on and acts as an active current sink. The different spatial location, physical layout (shape, size), metallization etc. of the PMOS and NMOS with respect to the sense resistor 104 will lead to spatial variation in current which can lead to non-linearity in the measured current as discussed above.

Embodiments of the present disclosure mitigate the problem of non-linearity of a sense resistor arising from bidirectional current flow through the sense resistor. Embodiments thus relate to monitoring current using a sense resistor in a circuit in which the current path it is wished to monitor is bidirectional, i.e. the current may flow in opposite directions along the monitored current path at different times. In embodiments of the present disclosure, first and second sense resistors are used to monitor the relevant current path, e.g. the first and second sense resistors may be within the monitored current path. Each of the first and second sense resistors may exhibit a non-linearity with direction of current flow, but the first and second sense resistors are arranged to be matching, so the non-linearity of the first sense resistor is generally in the opposite sense to that of the second sense resistor, i.e. if the first sense resistor would indicate a greater value for a given magnitude of current flowing in a first direction in the monitored current path compared to the second, opposite direction, the second resistor would indicate a smaller value for the given current in the first direction compared to the second direction of current flow in the monitored current path. The non-linearity of the first sense resistor may be advantageously substantially equal and opposite to that of the second resistor. In particular, the first and second sense resistors may be configured to have a matching arrangement such that current flow through the first sense resistor when current is flowing in one direction in the monitored current path matches current flow through the second sense resistor when current is flowing in the opposite direction in the monitored current path.

Figure 4:
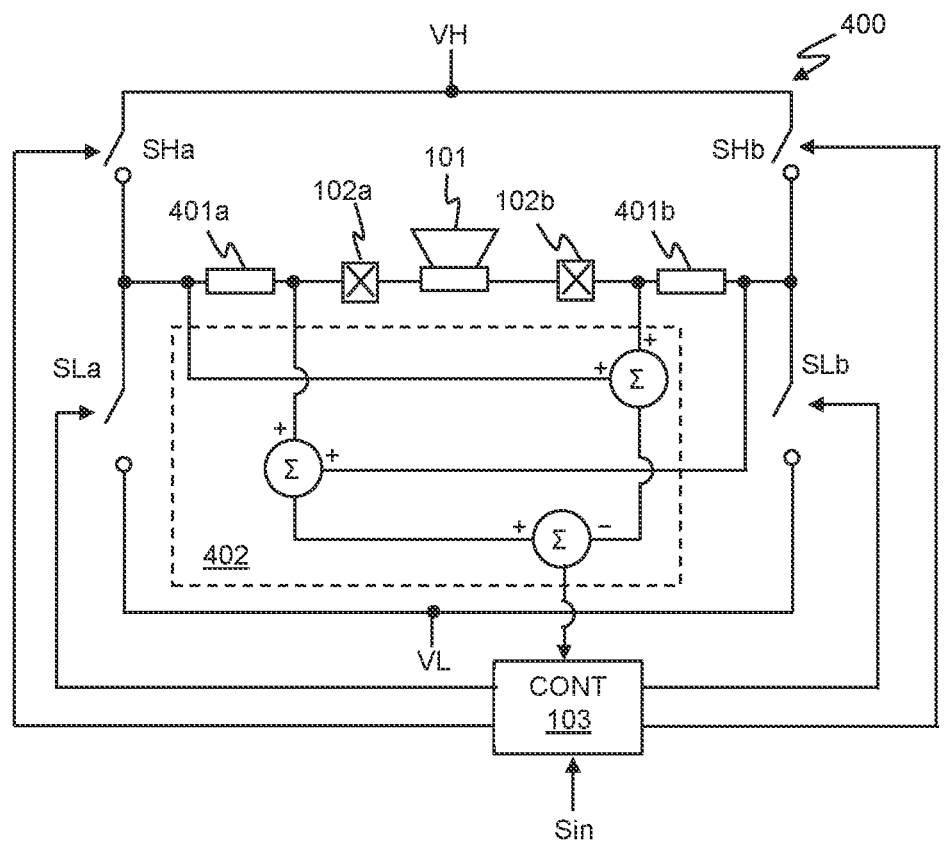
FIG. 4 illustrates one example of a driver circuit with current sensing according to an embodiment.

FIG. 4 illustrates an embodiment of the present disclosure for a switched driver circuit 400, similar to that discussed with reference to FIG. 1 and similar components will be implemented with similar reference numerals.

FIG. 4 again shows a load 101 driven in a BTL arrangement between output terminals 102a and 102b, with an H-bridge arrangement comprising switches SHa, SLa, SHb and SLb controlled by controller 103 to switch the output terminals 102a and 102b between the switching voltages VH and VL with a controlled duty cycle to generate a desired output voltage across the load 101.

In the example of FIG. 4 there are first and second sense resistors 401a and 401b in series with the load. The first sense resistor 401a is located between the switches SHa and SLa and the output terminal 102a and the second sense resistor is located between the switches SHb and SLb and the output terminal 102b.

In use, when the driver is in the first driver switch state, with switches SHa and SLb on (and SLa and SHb off), current will flow from the high-side switch SHa into the first sense resistor 401a and from the first sense resistor 401a to the first output terminal 102a and current will flow from the second output terminal into the second sense resistor 401b and from the second sense resistor into the low-side switch SLb. When the driver is in the second driver state, with switches SLa and SHb on (and SHa and SLb off) current will flow from the high-side switch SHb into the second sense resistor 401b and from the second sense resistor 401b to the second output terminal 102b and current will flow from the first output terminal into the first sense resistor 401a and from the first sense resistor 401a into the low-side switch SLa.

Thus in each of the first and second driver switch states current flows from one of the high-side switches into one of the sense resistors and then into one of the output nodes, whilst current flows from the other output node into the other sense resistor and then into the relevant low-side switch. Whilst each of the first and second sense resistors may exhibit a non-linearity due to the direction of current flow, the non-linearity exhibited by the first and second sense resistors may be substantially equal and opposite. In other words, for each of the first and second sense resistors, given magnitude of current may give rise to a different monitored voltage difference across the sense resistor depending on the direction of current, i.e. whether current flows from the relevant high-side switch toward the output terminal or from the output terminal toward the relevant low-side switch, but the variation may be the same for each of the first and sense resistors.

Advantageously, the voltage difference across the first sense resistor 401a that would be detected in response to a given magnitude of current, say I1, flowing from the high-side switch SHa to the first sense resistor 401a and onto the first output terminal 102a may be substantially the same voltage difference that would be detected across the second sense resistor 104b in response to the same magnitude of current I1 flowing from the high-side switch SHb to the second sense resistor 401b and onto the second output terminal 102b. Likewise the voltage difference across the first sense resistor 401a that would be detected in response to the magnitude of current I1 flowing from the first output terminal 102a to the first sense resistor 401a and onto the low-side switch SLa may be substantially the same voltage difference that would be detected across the second sense resistor 104b in response to the same magnitude of current I1 flowing from the second output terminal 102b to the second sense resistor 401b and onto the low-side switch SLb. The first and second sense resistors 401a and 401b may thus have the same nominal resistance value as one another.

By combining the monitored currents/voltages from both the first and second sense resistors 401a and 401b the non-linearity arising from direction of current flow can be at least partly compensated or eliminated. A current monitor circuit 402 may thus be arranged to combine the voltage monitored across the first and second sense resistors. In the example of FIG. 4 the voltages on one side (in terms of the direction of current flow in the monitored path) of the first and second sense resistors 401a and 401b are summed, as are the voltage on the other side of the first and second sense resistors 401a and 401b, and the two summed voltages are subtracted from each other to provide a voltage difference which is the combined voltage difference across both sense resistors 401a and 401b. This combined voltage difference can be used as an indication of the current in the monitored path in which non-linearity arising from the direction of current flow is at least partly compensated for.

This arrangement also has the advantage that when operating in the first driver switch state or the second driver switch state the common-mode voltage component is automatically cancelled. It should be understood, however, that other arrangements for combining the voltages could be implemented, for instance the voltages on the respective first and second sides of each of the first and second sense resistors 401a and 401b could be subtracted to determine the voltage difference across each of the first and second sense resistors 401a and 401b, and the two voltage differences summed to provide a combine value.

Each of the first and second sense resistors 401a and 401b may be a sense resistor such as discussed above with reference to FIG. 2 and may for instance be formed from a thin film resistor material such as TaN. The first and second resistors can be formed from the same material as one another and may generally have matching dimensions and geometries as one another. The first and second sense resistors 401a and 401b may generally be formed at the same time as one at the same stage in circuit fabrication so as to have generally matching properties. Advantageously, the first and second sense resistors 401a and 401b may be located relatively close to one another in the circuit layout so as to experience generally the same operating conditions, such as temperature, as one another in use.

To provide the first and second sense resistors 401 and 401b with matching non-linearity, the spatial arrangement of the first and second sense resistors and may configured so as to be substantially matching, such that for current flow in the monitored path in each direction the spatial distribution of active current sources and sinks for the first sense resistor substantially matches the spatial distribution of active current sources and sinks for the second resistor for current flow in the opposite direction. That is the spatial arrangement of the first and second resistors 401a and 401b with respect to the high-side and low-side switch transistors and the output electrodes and their connections may be substantially matching. The first and second sense resistors 401 and 401b may, therefore be arranged symmetrically with respect to the local power switches, SHa, SLa, SHb and SLb.

Figure 5:
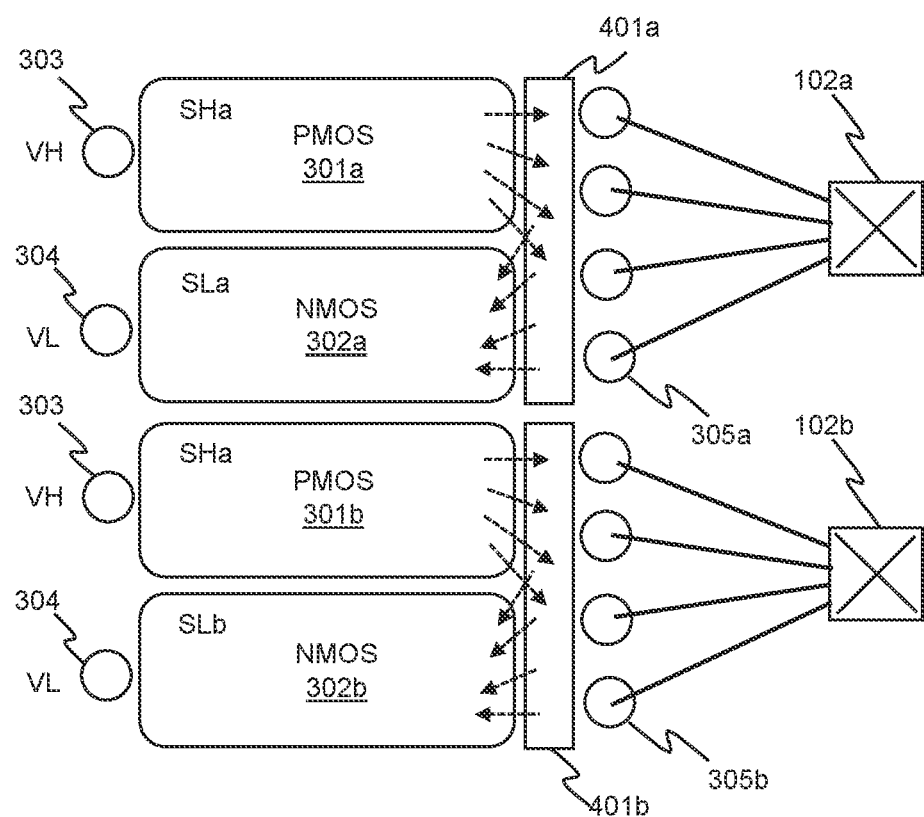
FIG. 5 illustrates one example layout of first and second sense resistors according to an embodiment.

FIG. 5 illustrates one example of a possible circuit layout for the high-side and low-side switches SHa, SLa, SHb, SLb and sense resistor. It should be understood, however, that the layout of FIG. 5 is a simplified pictorial layout for the purposes of explanation and is not intended to be an accurate representation of an actual physical implementation. FIG. 5 illustrates a similar layout arrangement as discussed with reference to FIG. 3 for the first sense resistor 401a with regard to the switches SHa and SLa, implemented in this example by a first PMOS device 301a and a first NMOS device 302a and first output electrode(s) 305a. FIG. 5 also illustrates that the switches SHb and SLb may be implemented by a second PMOS device 301b and a second NMOS device 302b, each associated with respective electrodes 303 and 304 for the switching voltages VH and VL. The second sense resistor 401b, which has a matching size and geometry as the first sense resistor 401a, is located in a spatial arrangement with respect to the second PMOS 301b, second NMOS 302b and second output electrode(s) 305b that matches the arrangement of the first sense resistor 401a to the first PMOS 301a, first NMOS 302a and first output electrode(s) 305a.

Note FIG. 5 illustrates just one possible example of a circuit layout for explanation and other arrangements are possible. For instance, the positions of the second PMOS 301b and second NMOS 302b could be swapped so that the second NMOS 302b is next to the first NMOS 302b, which could ease routing of connection for the electrodes for the switching voltage VL— or similarly the positions of the first PMOS 301a and first NMOS 302a could be swapped. It will be understood that in either of these cases the physical arrangement of the first sense resistor with respect to the first PMOS and NMOS may then be a mirror image of the physical arrangement of the second sense resistor with respect to the second PMOS and NMOS, i.e. so in addition to the positions of the second PMOS 301b and second NMOS 302b (PMOS 301a and NMOS 301b) being swapped, the sense resistor 401a (or 401b) would also be mirrored or flipped (in terms of geometry and layout), but this is still a matching arrangement as the relative spatial arrangement is the same, i.e. topologically the arrangements match. Thus, it should be understood that the physical arrangement of the second sense resistor 401b with respect to the second PMOS and NMOS devices 301b and 302b may be mirrored and/or rotated version of the physical arrangement of the first sense resistor 401a with respect to the first PMOS and NMOS devices 301a and 301b and still be a matching spatial arrangement.

As noted above, the example of FIG. 5 is just one example of a layout arrangement and a variety of other layout arrangements could be implemented.

Each of the first and second sense resistors 401a and 401b has dimensions selected to provide a desired nominal resistance. As noted above, the aspect ratio of each sense resistor (in terms of W/L where L is the length in the direction of current flow through the sense resistor and W is the width) required to provide the desired nominal resistance and current handling capability may be quite high. In some cases the required width for each sense resistor may be relatively large, which may not be efficient or practical from a layout perspective. In some implementation the sense resistor could be implemented by a plurality of connected resistor segments, where at least some of the resistor segments are not co-linear (i.e. do not extend along the same straight line as one another). The various resistor segments may each have the required length in the direction of current flow and each of the segments may have an appropriate width such that the sum of the widths of all the resistor segments provides the required width. In some examples at least part of the sense resistor may be implemented to have a generally serpentine structure and/or at least part of the sense resistor may be implemented to have a comb like structure with a plurality of resistor segments extending substantially parallel to one another.

Figure 6:
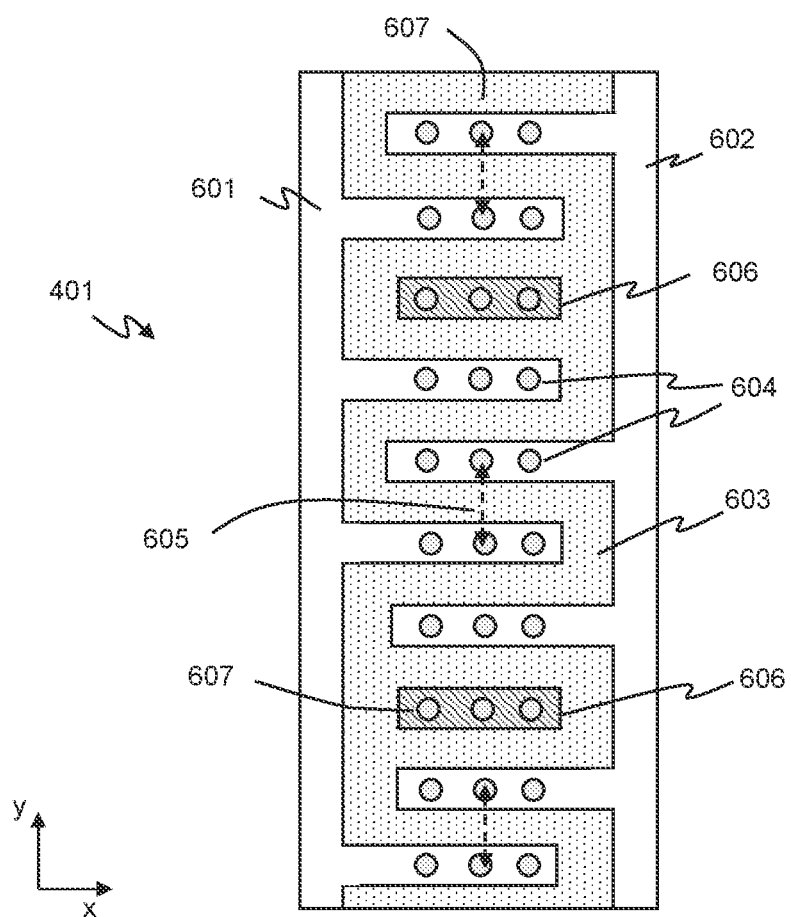
FIG. 6 illustrates one example of a sense resistor with a serpentine configuration.

FIG. 6 illustrates one example of at least part of a sense resistor 401 having a generally serpentine structure. The sense resistor 401 comprises first and second electrodes 601 and 602 and an underlying (or overlying) layer of resistive material 603, which may for instance be a resistive material such as TaN. The first and second electrodes 601 and 602 are provided for forming input/output connections in the relevant current path and comprise, in this example, interdigitated fingers extending in the x-direction as illustrated so that the resistive material effectively forms an active resistor that follows a serpentine path around the electrode fingers. The electrodes 601 and 602 conduct current into the resistive layer 603 via a plurality of connection points 604, such as vias or the like, along the interdigitated fingers. This effectively divides the sense resistor into a plurality of substantially parallel resistor segments, with resistor segments being located between (in this example in the y-direction as illustrated) adjacent fingers of the first and second electrodes 601 and 602. In use, therefore, current will flow between the fingers of the first and second electrodes 601 and 602, for example as illustrated by arrow 605. The length of each segment in the direction of current flow (in this case in the y-direction) is the length L of the sense resistor. Each individual segment has a width, in this case in the x-direction as illustrated, and the sense resistor is configured such that the sum of the widths of all the individual segments provides the required total width for the sense resistor.

To monitor the voltage drop across the sense resistor there are at least a pair of sense points 606, which connect to the resistive material layer 603 via connection points or vias 607. The sense points 606 are positioned to monitor the voltage drop due to current flowing through one or more of the resistor segments and are located so as to effectively monitor the voltages on either side of the resistor (in terms of current flow direction). In some implementations, as illustrated in FIG. 6, one sense point may be located between two fingers of the first electrode 601 with another sense point being located between two fingers of the second electrode 602, so as to be effectively positioned on opposite sides of the relevant resistor segment(s), although other spatial arrangements are possible, as would be understood by one skilled in the art.

Figure 7:
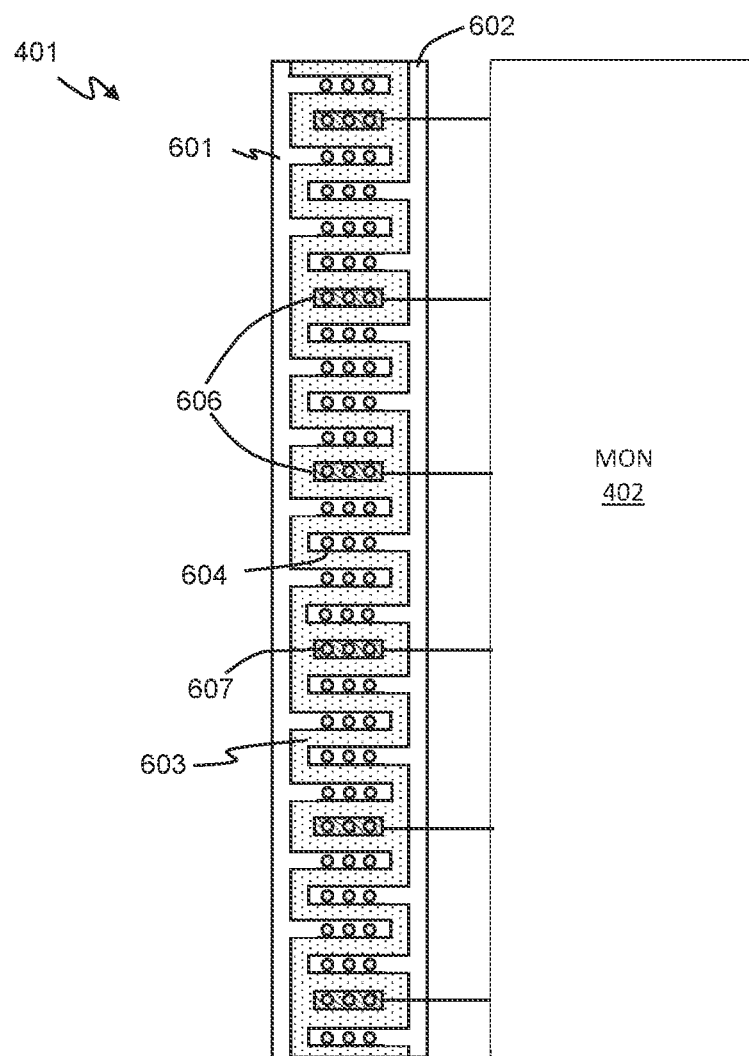
FIG. 7 illustrates a sense resistor with more than two sense points.

In some applications there may be more than just one pair of sense points. For example, FIG. 7 illustrates an example of sense resistor 401 which may, for instance have the structure illustrated in FIG. 6. FIG. 7 illustrates that there are more than two sense points 606, with the sense points being located at different positions through the sense resistor 401. This can allow a voltage drop across different parts of the sense resistor to be separately determined by the current monitor 402. The current monitor 402 may be configured to combine or average the monitored voltage drops across different parts of the sense resistor so as to compensate for the different spatial current density across the sense resistor when current is flowing through the monitored path in a given direction.

The use of multiple sense points at different locations of the sense resistor can thus mitigate for non-linearity that arises from a variable current density through the sense resistor when current is flowing in a given direction, with the use of two such sense resistors mitigating for the non-linearity due to current direction.

Embodiments of the present disclosure thus relate to apparatus and monitoring for current monitoring using sense resistors in which at least two sense resistors are arranged to monitor current through a current path.

Embodiments of the present disclosure may, in particular, have a sense resistor arranged in the current path on each side of the load. For instance, referring back to FIG. 4, this example has a sense resistor on each side of the H-bridge, i.e. the first sense resistor 401a is on one side of the H-bridge and coupled to output terminal 102a and the second sense resistor is on the other side of the H-bridge and coupled to output terminal 102b. This arrangement allows the current sensing to also be used to detect a short-circuit or other overcurrent condition at either of the output terminals 102 and 102b.

It is desirable to be able to detect a short-circuit condition that could occur at one of the output terminals 102a and 102b which could lead to an overcurrent, i.e. a higher current than expected in normal operation, which in some cases could be sufficiently high to cause damage to components. For instance, if the high-side switch SHa is on (with the low-side switch SLa off), a short-circuit between the output terminal 102a and the low-side voltage VL could lead to a high current flowing via the high-side switch SHa and the output terminal 102a. Likewise, if the low-side switch SLa is on (with the-low-side switch SHa off) a short-circuit between the output terminal 102a and the high-side voltage VL could equally lead to a high current. A short-circuit between the output terminals 102a and 102b could also lead to a relatively high current, depending on the state of the output bridge on both sides.

Conventional current monitoring such as discussed with reference to FIG. 1, where the current is monitored on one side of the load only, would not be capable of detecting a short-circuit condition leading to an overcurrent on the other side of the load. In implementations with such conventional current monitoring, there may, therefore, be separate circuitry (not illustrated) for detecting a short-circuit or similar condition that could lead to an overcurrent on one side of the load only. In some cases such short-circuit detection could monitor the voltage at the relevant output terminal against an expected voltage level or voltage threshold. For instance, if the high-side switch SHa is closed (with the low-side switch SLa open), then the voltage at the output terminal 102a may be expected to be close to the high-side voltage VH. If there were a short-circuit to the low-side voltage VL, this will pull the voltage at the output terminal 102a down towards VL. If, instead, the low-side switch SLa is closed (with the high-side switch SHa open) then the voltage at the output terminal 102a would be expected to be close to the low-side voltage VL. If, in this state, there is a short to the high-side voltage VH, this will pull the voltage at the output terminal 102a up towards VH. In either state, i.e. with either SHa or SLa closed, if there is a short-circuit between the output terminals 102a and 102b then, depending on the state of the other side of the bridge, the voltage at output terminal 102a could be pulled down or up respectively.

The voltage at each output terminal 102a and 102b could be monitored to determine whether it changes by more than a certain amount from the expected voltage given the switch state on that side of the H-bridge. This could, for example, be implemented by a comparator comparing the voltage at the output node to an appropriate voltage threshold given the switch state of the bridge on that side of the load.

However, embodiments of the present disclosure can effectively monitor the current on both sides of the load and such an arrangement can therefore be used to detect a short-circuit condition, or some other fault condition, that may lead to an overcurrent on one side of the load only. An overcurrent condition can be detected by monitoring the current detected by the current monitor circuit 402.

For instance, for the example of FIG. 4, the value of the current which is monitored by the current monitor circuit 402 is based on the combined currents through each of the sense resistors 401a and 401b. If, for example, there was a short circuit to VL at output node 102a when the high-side switch SHa is closed (or equivalently a short-circuit to VH when the low-side switch SLa is closed), this could lead to a high current flowing via the sense resistor 401a which will lead to an increase in the current detected by the current monitor circuit 402. The current monitor circuit 402 may thus be configured to monitor the determined value of current against at least one current threshold, which can be set based on the highest expected current value in normal operation. If the monitored current crosses this current threshold, this can indicate an overcurrent condition and the operation of the switched driver circuit 400 may be disabled or suspended, for instance by switching the switches SHa, SLa, SHb and/or SLb to a high-impedance state. In some embodiments, e.g. for a switched driver circuit 400 for driving an inductive load, the current monitor circuit 402 may take the voltage and current phase relationship into account and may, for instance, adjust the threshold accordingly. The threshold may also be adjusted based on headroom.

The current monitor circuit 402 may thus be configured to provide overcurrent monitoring which includes monitoring for a short-circuit condition or other condition that leads to an overcurrent on one side of the load only.

In some embodiments, this short-circuit monitoring provided by the current monitor circuit 402 may be in addition to some other short-circuit monitoring to provide additional functionality. For instance, as discussed above there may be one or more comparators for comparing the voltage at each output node 102a or 102b with respective voltage thresholds based on the switch state of the H-bridge. These voltage thresholds are typically set so that the relevant comparator will trigger when the monitored output node 102a or 102b is short-circuited by a short-circuit path with a resistance of less than a certain resistance value, $R_{SC}$. However, the threshold should also be set so that the comparators are not triggered in normal use, where the output terminal 102a is connected to the voltage VH or VL via the load 101 and the other side of the bridge. Thus, a connection between the output terminal 102a and the voltage VH or VL via a minimum expected load resistance Rloadmin should not be sufficient to trigger the relevant comparator. In some cases, to achieve this behaviour the value of the resistance $R_{SC}$ of a short-circuit path, at which the relevant comparator will trigger, may be somewhat lower than the minimum expected load resistance Rloadmin. Thus, if a short circuit were to occur, but with a path resistance greater than $R_{SC}$, the voltage at the output node may not cross the relevant threshold and no short-circuit condition may be detected. Previously, such operation may not have been a concern as the relevant voltages may be relatively low and thus may not lead to a high overcurrent in such a situation, and/or the relevant voltages may be generated by a boost converter or the like that provides maximum output current limiting. However, higher voltages may be used in some applications and/or the voltages may be generated in a manner that does not inherently provide current limiting, e.g. by capacitive voltage generation using a charge pump or similar. The current monitoring of embodiments of the disclosure can thus monitor for an overcurrent which may arise with a short circuit with a resistance greater than would be detected by the other short-circuit detection circuitry.

In some embodiments, this overcurrent monitoring may provide all of the short-circuit monitoring functionality, in which case some additional short-circuit monitoring circuitry, such as the comparators discussed above may not be required. This can save on circuit size and area.

This monitoring of current on both sides of the load represents an aspect of the disclosure that could be implemented separately to the matching of the sense resistors. However, in at least some embodiments, as discussed above the sense resistors may be arranged to be substantially matching, such that current flow through the first sense resistor when current is flowing in one direction in the monitored current path matches current flow through the second sense resistor when current is flowing in the opposite direction in the monitored current path. A spatial arrangement of active current sources and sinks seen by one sense resistor for current flow in a first direction may thus match that of the other sense resistor for current flow in the opposite direction in the monitored current path, and vice versa. In this way, any non-linearity with current direction for one of the sense resistors may be the opposite of that of the other sense resistor and by combining the voltages or current sensed by both sense resistors, the non-linearity with current directions can reduced or eliminated.

Embodiments have been discussed above in respect to switching driver circuits such as class-D amplifiers and the use of two sense resistors in such applications as advantageous. However, the principles of the present disclosure are applicable to any circuitry where current monitoring is desirable and the current in the relevant current path to be monitored may be bidirectional, in particular where current density through a sense resistor may vary with direction of current flow, such as various types of DC-DC converter or various signal processing circuits.

Note that in the embodiments discussed above the first and second sense resistors are located in the same current path, which is the current path it is wished to monitor. In some applications, the sense resistors may be located in a sensing path which is driven so that the current in the sensing path is related to a current in a main current path. Monitoring the current of the sensing path thus provides sensing of the main current path without requiring any sense resistors in the main current path. In such a case it could be possible for the first and second sense resistors to be located in separate sensing paths.

Embodiments may be implemented as an integrated circuit. The sense resistors may be formed as thin film resistors on an integrated circuit die. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A current sensor for sensing current in a monitored current path,
wherein the monitored current path is bidirectional such that current can flow in either direction along the monitored current path, the current sensor comprising:
first and second sense resistors configured to each pass a current corresponding to the current in the monitored current path, wherein the first and second sense resistors are configured to have a matching arrangement such that current flow through the first sense resistor when current is flowing in one direction in the monitored current path matches current flow through the second sense resistor when current is flowing in the opposite direction in the monitored current path; and
wherein each of the first and second sense resistors are arranged such that current can flow, via the respective sense resistor, from a respective first transistor to a respective first electrode or from the respective first electrode to a respective second transistor and wherein:
for current flow in a first direction in the monitored current path, current flows through the first sense resistor from the respective first transistor to the respective first electrode and current flows through the second sense resistor from the respective first electrode to the respective second transistor; and
for current flow in a second direction in the monitored current path, current flows through the first sense resistor from the respective first electrode to the respective second transistor and current flows through the second sense resistor from the respective first transistor to the respective first electrode.

2. The current sensor of claim 1 wherein the first and second sense resistors are each located in the monitored current path.

3. The current sensor of claim 1 wherein the first transistor is a PMOS transistor and the second transistor is an NMOS transistor.

4. The current sensor of claim 1 wherein a spatial configuration of the first sense resistor with respect to the respective first and second transistors and first electrode matches a spatial configuration of the second sense resistor with respect to the respective first and second transistors and first electrode.

5. The current sensor of claim 1 comprising a monitor circuit configured to determine voltages across the first and second sense resistors and to provide an indication of current in the monitored current path based on the determined voltages.

6. The current sensor of claim 5 wherein the monitor circuit is configured to:
generate a first summed voltage as a sum of a voltage on a first side of the first sense resistor with a voltage on a first side of the second sense resistor;
generate a second summed voltage as a sum of a voltage on a second side of the first sense resistor with a voltage on a second side of the second sense resistor; and
determine the voltage difference between the first and second summed voltages;
wherein the first side of the first and second sense resistors is the side that receives an input current when current is flowing in the monitored current path in a first direction.

7. The current sensor of claim 1 wherein each of the first and second sense resistors comprises a thin-film resistor material.

8. The current sensor of claim 1 wherein each of the first and second sense resistors comprises a tantalum nitride resistor.

9. The current sensor of claim 1 wherein each of the first and second sense resistors comprises a plurality of connected resistor segments wherein at least some of the plurality of resistor segments are not co-linear.

10. The current sensor of claim 9 wherein at least some of the plurality of resistor segments are substantially parallel to one another and arranged in a serpentine or comb configuration.

11. The current sensor of claim 1 wherein each of the first and second sense resistors comprises a plurality of sense points for sensing the voltage across at least part of the sense resistor.

12. The current sensor of claim 11 wherein each of the first and second sense resistors comprises more than two sense points located at different locations of the sense resistor so as to enable a voltage across different parts of the sense resistor to be determined.

13. The current sensor of claim 1 wherein the monitored current path is an output path for a switching driver for driving a load in a bridge-tied-load configuration.

14. The current sensor of claim 1 implemented as an integrated circuit.

15. A current sensor for sensing current in a monitored current path, wherein the monitored current path is bidirectional such that current can flow in either direction along the monitored current path, the current sensor comprising:
- first and second sense resistors configured to each pass a current corresponding to the current in the monitored current path, wherein the first and second sense resistors are configured to have a matching arrangement such that current flow through the first sense resistor when current is flowing in one direction in the monitored current path matches current flow through the second sense resistor when current is flowing in the opposite direction in the monitored current path; and
- a monitor circuit configured to determine voltages across the first and second sense resistors and to provide an indication of current in the monitored current path based on the determined voltages, wherein the monitor circuit is configured to:
  - generate a first difference voltage as the difference between voltage on first and second sides of the first sense resistor;
  - generate a second difference voltage as the difference between voltages on first and second sides of the second sense resistor; and
  - determine the voltage sum between the first and second difference voltages;
- wherein the first side of the first and second sense resistors is the side that receives an input current when current is flowing in the monitored current path in a first direction.

16. A current sensor for sensing current in a monitored current path, wherein the monitored current path is bidirectional such that current can flow in either direction along the monitored current path, the current sensor comprising:
- first and second sense resistors configured to each pass a current corresponding to the current in the monitored current path, wherein the first and second sense resistors are configured to have a matching arrangement such that current flow through the first sense resistor when current is flowing in one direction in the monitored current path matches current flow through the second sense resistor when current is flowing in the opposite direction in the monitored current path;
- wherein the monitored current path is an output path for a switching driver for driving a load in a bridge-tied-load configuration; and
- wherein the first sense resistor is connected in the output path for providing an output to one side of the load and the second sense resistor is connected in the output path for providing an output to an opposite side of the load.

17. The current sensor of claim 16 comprising a monitor circuit configured to determine voltages across the first and second sense resistors and to provide an indication of current in the monitored current path based on the determined voltages wherein the monitor circuit is configured to compare the indication of current in the monitored current path against a current threshold to detect an overcurrent condition on either side of the load.

18. A current sensor for sensing current in a monitored current path, wherein the monitored current path is bidirectional such that current can flow in either of a first direction or a second, opposite, direction along the monitored current path, the current sensor comprising:
- first and second sense resistors configured to each pass a current corresponding to the current in the monitored current path, wherein the first and second sense resistors are configured such that:
  - a spatial arrangement of active current sources and sinks for the first sense resistor with current in the monitored path in the first direction matches a spatial arrangement of active current sources and sinks for the second sense resistor with current in the monitored path in the second direction; and
  - a spatial arrangement of active current sources and sinks for the first sense resistor with current in the monitored path in the second direction matches a spatial arrangement of active current sources and sinks for the second sense resistor with current in the monitored path in the first direction.

19. The current sensor of claim 18 wherein the current sources and sinks for each of the first and second sense resistors comprise respective first and second transistors and a respective output electrode.

20. A current sensor for sensing current in a monitored current path, wherein the monitored current path is bidirectional such that current can flow in either direction along the monitored current path, the current sensor comprising:
- a first sense resistor configured to pass a current corresponding to the current in the monitored current path, wherein the first sense resistor exhibits a non-linearity with direction of current flow in the monitored current path; and
- a second sense resistor configured to pass a current corresponding to the current in the monitored current path, wherein the second sense resistor exhibits a non-linearity with direction of current flow in the monitored current path;
- wherein the non-linearity of the first sense resistor is opposite to the non-linearity of the second sense resistor.

21. The current sensor of claim 20 wherein the non-linearity of the first sense resistor is equal and opposite to the non-linearity of the second sense resistor.

* * * * *